US012564092B2

(12) United States Patent
Uhlig

(10) Patent No.: US 12,564,092 B2
(45) Date of Patent: Feb. 24, 2026

(54) POWER SEMICONDUCTOR PACKAGE HAVING A VOLTAGE STABILIZING ADDITIVE AND METHOD FOR FABRICATING THE POWER SEMICONDUCTOR PACKAGE

(71) Applicant: Infineon Technologies AG, Neubiberg (DE)

(72) Inventor: Johannes Uhlig, Soest (DE)

(73) Assignee: Infineon Technologies AG, Neubiberg (DE)

( * ) Notice: Subject to any disclaimer, the term of this patent is extended or adjusted under 35 U.S.C. 154(b) by 422 days.

(21) Appl. No.: 17/200,951

(22) Filed: Mar. 15, 2021

(65) Prior Publication Data

US 2021/0296191 A1     Sep. 23, 2021

(30) Foreign Application Priority Data

Mar. 20, 2020     (EP) .................................... 20164510

(51) Int. Cl.
*H01L 23/29* (2006.01)
*H01L 21/56* (2006.01)
*H01L 23/31* (2006.01)
*H01L 23/60* (2006.01)

(52) U.S. Cl.
CPC ............ *H01L 23/295* (2013.01); *H01L 21/56* (2013.01); *H01L 23/3121* (2013.01); *H01L 23/60* (2013.01)

(58) Field of Classification Search
CPC .... H01L 23/295; H01L 23/3121; H01L 21/56
USPC ......................................... 257/788
See application file for complete search history.

(56) References Cited

U.S. PATENT DOCUMENTS

| | | | |
|---|---|---|---|
| 2005/0287350 A1* | 12/2005 | Crouthamel | .......... H01L 23/295 |
| | | | 428/321.1 |
| 2011/0025612 A1* | 2/2011 | Shiau | ......................... C08F 2/48 |
| | | | 345/173 |
| 2012/0192946 A1* | 8/2012 | Becker | .................... C08L 23/02 |
| | | | 524/323 |
| 2017/0025344 A1 | 1/2017 | Kanai | |
| 2019/0318996 A1 | 10/2019 | Mauder et al. | |
| 2021/0020581 A1* | 1/2021 | Kuan | ...................... H01L 24/97 |

* cited by examiner

*Primary Examiner* — Quoc D Hoang
(74) *Attorney, Agent, or Firm* — Murphy, Bilak & Homiller, PLLC

(57)     ABSTRACT

A power semiconductor package includes a substrate, a power semiconductor chip arranged on the substrate, and an encapsulant encapsulating the power semiconductor chip. The encapsulant includes a voltage stabilizing additive. The voltage stabilizing additive is configured to minimize or eliminate partial discharges within the encapsulant.

1 Claim, 4 Drawing Sheets

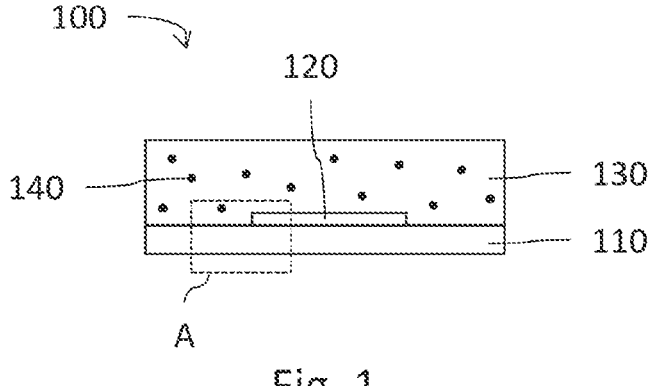
Fig. 1
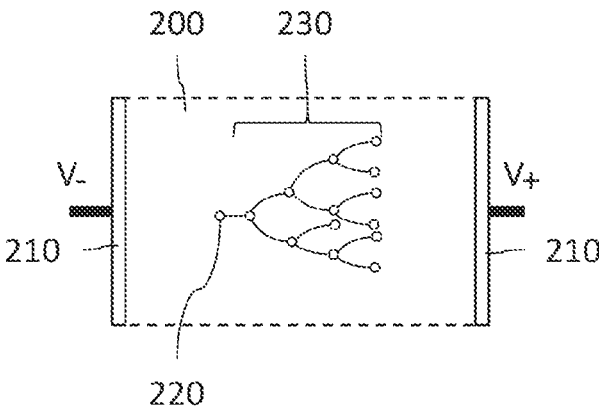
Fig. 2
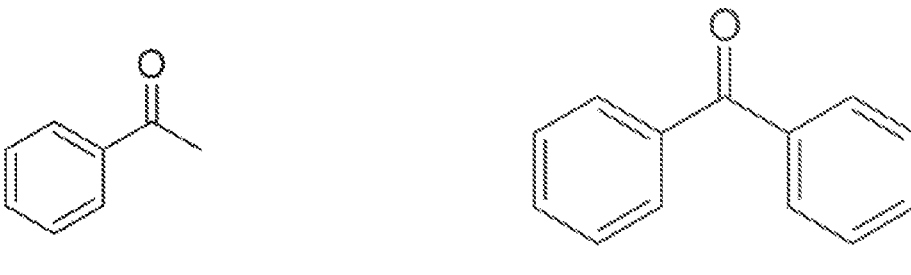
Fig. 3A                                    Fig. 3B

700

Providing a substrate — 701

Arranging a power semiconductor chip on the substrate — 702

Encapsulating the power semiconductor chip with the encapsulant, wherein the encapsulant comprises a voltage stabilizing additive, the voltage stabilizing additive being configured to minimize or eliminate partial discharges within the encapsulant — 703

POWER SEMICONDUCTOR PACKAGE HAVING A VOLTAGE STABILIZING ADDITIVE AND METHOD FOR FABRICATING THE POWER SEMICONDUCTOR PACKAGE

TECHNICAL FIELD

This disclosure relates in general to a power semiconductor package and to a method for fabricating a power semiconductor package.

BACKGROUND

Power semiconductor packages, e.g. comprising AC/DC- or DC/DC-converter circuits, may be operated with high electric voltages and/or high electric currents. Due to, among other things, the small size of power semiconductor packages and the close proximity of their electrical components, demanding insulation requirements have to be met. Typical insulator components that may be used in a power semiconductor package are encapsulant, plastic frames, insulating glues, etc. Such components may usually comprise a polymer matrix. However, defects in such insulators, e.g. gas filled voids, may be the point of origin of electrical faults like partial discharges, which in turn may cause sufficient damage to the insulator that electric shorts are made possible. It may be impractical or even impossible to further reduce the number or the size of the defects in the insulators like the gas filled voids. Therefore, it may be beneficial to use improved power semiconductor packages and improved methods for fabricating power semiconductor packages comprising improved electrical insulators.

The problem on which the invention is based is solved by the features of the independent claims. Further advantageous examples are described in the dependent claims.

SUMMARY

Various aspects pertain to a power semiconductor package, comprising: a substrate, a power semiconductor chip arranged on the substrate, and an encapsulant encapsulating the power semiconductor chip, wherein the encapsulant comprises a voltage stabilizing additive, the voltage stabilizing additive being configured to minimize or eliminate partial discharges within the encapsulant.

Various aspects pertain to a method for fabricating a power semiconductor package, the method comprising: providing a substrate, arranging a power semiconductor chip on the substrate, and encapsulating the power semiconductor chip with the encapsulant, wherein the encapsulant comprises a voltage stabilizing additive, the voltage stabilizing additive being configured to minimize or eliminate partial discharges within the encapsulant.

Various aspects pertain to a use of a voltage stabilizing additive in a power semiconductor package, the voltage stabilizing additive being configured to minimize or eliminate partial discharges within an encapsulant of the power semiconductor package.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Identical reference numerals designate corresponding similar parts.

FIG. 1 shows a schematic sectional view of a power semiconductor package, wherein an insulator of the power semiconductor package comprises a voltage stabilizing additive.

FIG. 2 shows a schematic view of an electron avalanche in an electrical insulator caused by a partial discharge.

FIGS. 3A to 3C show examples of different substances that may be used as voltage stabilizing additives in a power semiconductor package.

FIG. 4 schematically shows how a voltage stabilizing additive may prevent partial discharges from damaging an insulator.

DETAILED DESCRIPTION

Figures 3C, 4:
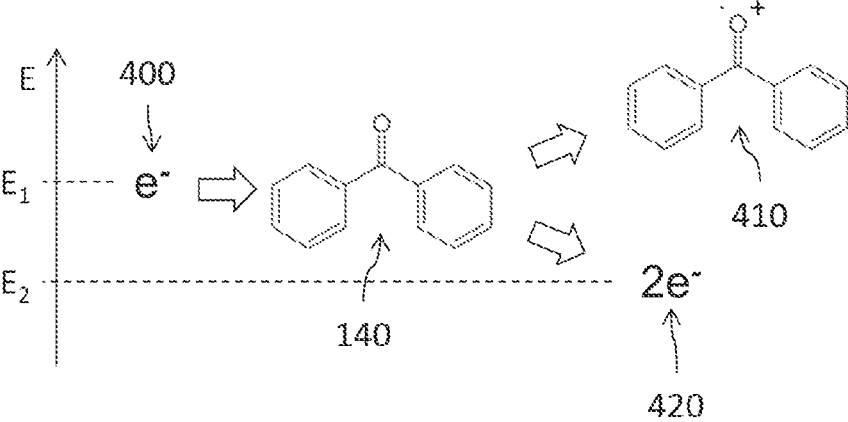

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a power semiconductor package may use various types of semiconductor chips or circuits incorporated in the semiconductor chips, among them AC/DC or DC/DC converter circuits, power MOSFET transistors, power Schottky diodes, JFETs (Junction Gate Field Effect Transistors), power bipolar transistors, logic integrated circuits, analogue integrated circuits, power integrated circuits, chips with integrated passives, etc. Moreover, the examples of insulation materials may, for example, be used for providing insulation layers in various types of enclosures and insulation for electrical circuits and components, and/or for providing insulation layers in various types of semiconductor chips or circuits incorporated in semiconductor chips, including the above-mentioned semiconductor chips and circuits.

The power semiconductor packages described below may include one or more semiconductor chips. By way of example, one or more power semiconductor chips may be included. Further, one or more logic integrated circuits may be included in the power semiconductor packages. The logic integrated circuits may be configured to control the integrated circuits of other semiconductor chips, for example the integrated circuits of power semiconductor chips. The logic integrated circuits may be implemented in logic chips.

FIG. 1 shows a power semiconductor package 100 comprising a substrate 110, a power semiconductor chip 120 and an encapsulant 130. The power semiconductor chip 120 is arranged on the substrate 110 and the encapsulant 130 encapsulates the power semiconductor chip 120. Furthermore, the encapsulant 130 comprises a voltage stabilizing additive 140, the voltage stabilizing additive 140 being configured to minimize or eliminate partial discharges within the encapsulant 130.

The power semiconductor package 100 may be configured to be operable with a high electrical voltage (e.g. a voltage of 6.5 kV or more) and/or a high electrical current. The power semiconductor package 100 may for example comprise a converter circuit, a half-bridge circuit, an inverter circuit or any other suitable circuit. The power semiconductor package 100 may for example be configured to be employed in an automotive application.

The power semiconductor package 100 may be configured to be attached to a baseplate, for example such that the substrate 110 is arranged on the baseplate. The power semiconductor package 100 may be configured to be attached to a heatsink. Furthermore, the power semiconductor package 100 may be configured to be connected to a circuit board. For example, the circuit board may be arranged at an upper main side of the power semiconductor package 100, opposite a lower main side, wherein the lower main side comprises the substrate 110.

In the example shown in FIG. 1, the power semiconductor package 100 comprises only one substrate 110. However, it is also possible that the power semiconductor package 100 comprises two or more substrates 110. Furthermore, the power semiconductor package 100 may comprise more than one power semiconductor chip 120, e.g. several power semiconductor chips 120 on a single substrate 110 or several substrates 110, wherein each of the substrates 110 carriers at least one power semiconductor chip 120.

The substrate 110 may be a die carrier and it may for example comprise a direct copper bond (DCB), a direct aluminum bond (DAB), an active metal brazing (AMB), or a leadframe.

The substrate 110 may comprise an upper main face, wherein the power semiconductor chip 120 is arranged on the upper main face, and an opposite lower main face. The upper main face may be partially or completely covered by the encapsulant 130. The lower main face may be partially or completely free of the encapsulant 130.

The power semiconductor chip 120 may be electrically coupled to the substrate 110. For example, a first power electrode arranged on a lower main face of the power semiconductor chip 120, wherein the lower main face faces the substrate 110, may be coupled to the substrate 110 via a solder joint. A second power electrode and/or a control electrode arranged on the upper main face opposite the lower main face may e.g. be coupled to the substrate 110 via one or more bond wires.

The encapsulant 130 may comprise a polymer and it may be electrically insulating. According to an example, the encapsulant 130 is a molded body or a gel arranged on the power semiconductor chip 120 and/or the substrate 110. The encapsulant 130 may be configured to completely encapsulate the power semiconductor chip 120. The encapsulant 130 may act as a protective cover that protects the power semiconductor chip 120 from the environment.

According to an example, the polymer of the encapsulant 130 is one or more of a polyethylene, a silicone, a polyimide, an epoxy resin, an acrylate, and a polyurethane.

According to an example, the encapsulant 130 may comprise one or more further additives apart from the voltage stabilizing additive 140. For example, the encapsulant 130 may comprise a filler material configured to improve heat dissipation capabilities of the encapsulant 130.

The voltage stabilizing additive 140 may be distributed evenly within the encapsulant 130. However, it is also possible that the voltage stabilizing additive 140 is not distributed evenly within the encapsulant 130. For example, the encapsulant 130 may comprise different parts, e.g. several layers, wherein one part comprises the voltage stabilizing additive 140 and another part does not comprise the voltage stabilizing additive 140.

According to an example of the encapsulant 130, the voltage stabilizing additive 140 may simply be admixed to the polymer. According to another example, the voltage stabilizing additive 140 may be covalently bound into the polymer matrix of the polymer. The latter case may for example offer the advantage that a diffusion or redistribution of the voltage stabilizing additive 140 (in particular while the encapsulant 130 is still fluid during fabrication of the power semiconductor package 100) is prevented or at least reduced.

The encapsulant 130 may comprise any suitable amount of the voltage stabilizing additive 140. For example, about 0.1 wt % to 10 wt %, or about 0.5 wt % to 5 wt %, or about 0.75 wt % to 2 wt % of the content of the encapsulant 130 may consist of the voltage stabilizing additive 140.

Apart from the encapsulant 130, the power semiconductor package 100 may comprise further components that comprise the voltage stabilizing additive 140. For example, the power semiconductor package 100 may comprise a (hard) plastic frame and/or a glue comprising the voltage stabilizing additive 140. Different components of the power semiconductor package 100 may comprise different amounts of the voltage stabilizing additive 140 and/or different types of voltage stabilizing additive (examples of different voltage stabilizing additives are described further below).

In the following, a brief description of "partial discharges" is given. A partial discharge may be a localized dielectric breakdown of an electrical insulator (e.g. a polymer) under high voltage stress. In other words, a partial discharge does not completely connect two conductors that are spaced apart (e.g. two conductive traces of a DCB).

FIG. 2 schematically shows a partial discharge occurring within an insulator 200 (the insulator 200 may e.g. correspond to the encapsulant 130) that is arranged in the space between two conductors 210. Due to e.g. background radiation an initial ionization event 220 occurs within the insulator 200. An electric potential difference between the two conductors 210 causes an electric field which accelerates the free electron towards the conductor 210 with the positive voltage $V_+$. In the case that the free electron is accelerated sufficiently, that is, in the case that its energy is high enough, it may cause further ionization events 230 (avalanche effect).

Such partial discharges usually occur in voids (gas filled voids) within the insulator 200 because the dielectric constant within a void is smaller than it is in the surrounding dielectric material. The electric field strength in the void is therefore higher than it is in the surrounding dielectric material.

In order to prevent partial discharges, it may therefore be desirable to minimize the amount and the size of voids in the insulator 200. However, beyond a certain point this may no longer be practical or economical. It may therefore be beneficial to add the voltage stabilizing additive 140 to the insulator 200 and thereby prevent or at least reduce partial discharges.

In the following, examples of substances that may be used as voltage stabilizing additive 140 are listed. Alternative substances are also contemplated.

According to an example, the voltage stabilizing additive 140 comprises one or more of the substances of the following list:

a thioxanthone a benzil a benzophenone an acetophenone a nitrated aromatic structure a halogenated aromatic a fullerene a $SiO_2$-particle a polycyclic aromatic a phenylenediamine a methylated phenothiazine a malononitrile FIGS. 3A to 3C show three different examples of substances that may be used in the voltage stabilizing additive 140.

FIG. 3A shows acetophenone (chemical formula: $C_6H_5C$ $(O)CH_3$), FIG. 3B shows benzophenone (chemical formula: $(C_6H_5)_2CO$), and FIG. 3C shows benzil (chemical formula: $(C_6H_5CO)_2$). Acetophenone may have a boiling point of 202° C., benzophenone may have a boiling point of 305° C. and benzil may have a boiling point of 346° C.

Acetophenone is an example of an aromatic carbonyl compound. Compared to e.g. benzophenone or benzil, it may migrate more easily out of the polymer matrix of e.g. the encapsulant 130. It may therefore be advantageous to use a voltage stabilizing additive 140 comprising an aromatic carbonyl or benzil-type compound with a larger alkoxy chain.

According to an example, a compound comprised in the voltage stabilizing additive 140 comprises modifications such as selected functional groups that increase the compatibility of the compound with the polymer matrix of e.g. the encapsulant 130. In particular, the voltage stabilizing additive 140 may be configured to be covalently bound into the polymer matrix of e.g. the encapsulant 130. For example, the voltage stabilizing additive 140 may comprise a substance like benzophenone that is arranged at the end of a silicone oligomer chain.

With reference to FIG. 4, a possible partial discharge preventing effect of the voltage stabilizing additive 140 is described.

A free electron 400 (e.g. caused by background radiation as described further above) within e.g. insulator 200 may have a comparatively high energy $E_1$ which may be sufficient to cause damage to the insulator 200. The insulator 200 however comprises the voltage stabilizing additive 140, which, without loss of generality, may comprise benzophenone. On impact with a molecule of the voltage stabilizing additive 140, the free electron 400 may cause ionization of the molecule. Thereby, a stable radical cation 410 is created and two electrons 420 having a comparatively lower energy $E_2$ are released. Since the voltage stabilizing additive 140 is ionized at a comparatively lower energy level than the insulator 200, the electrons 420 are prevented from having energy levels that would be sufficient to cause damage to the insulator 200.

Figure 5:
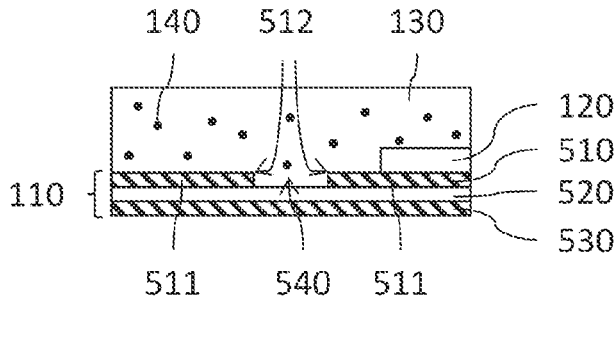
FIG. 5 shows a schematic sectional view of a detail of a power semiconductor package.

FIG. 5 shows a detail view of a section of a power semiconductor package which may be similar or identical to the power semiconductor package 100. According to an example, FIG. 5 may show the section A in FIG. 1.

The detail view of FIG. 5 shows an example of the substrate 110 that comprises an upper conductive layer 510, an insulating layer 520 and a lower conductive layer 530. The upper conductive layer 510 comprises two conductive tracks 511 that are separated by a trench 540. The trench may be filled with the encapsulant 130 comprising the voltage stabilizing additive 140.

At sharp edges of conductors like the edges 512 of the conductive tracks 511 the electric field strength may be particularly high, facilitating partial discharges in an adjoining insulator like the encapsulant 130. Furthermore, individual conductors like the conductive tracks 511 may be arranged close together in a power semiconductor package and partial discharges may readily be the cause of an electrical short between such conductors. It may therefore be particularly important to protect insulators close to the edges 512 with the voltage stabilizing additive 140.

Figure 6:
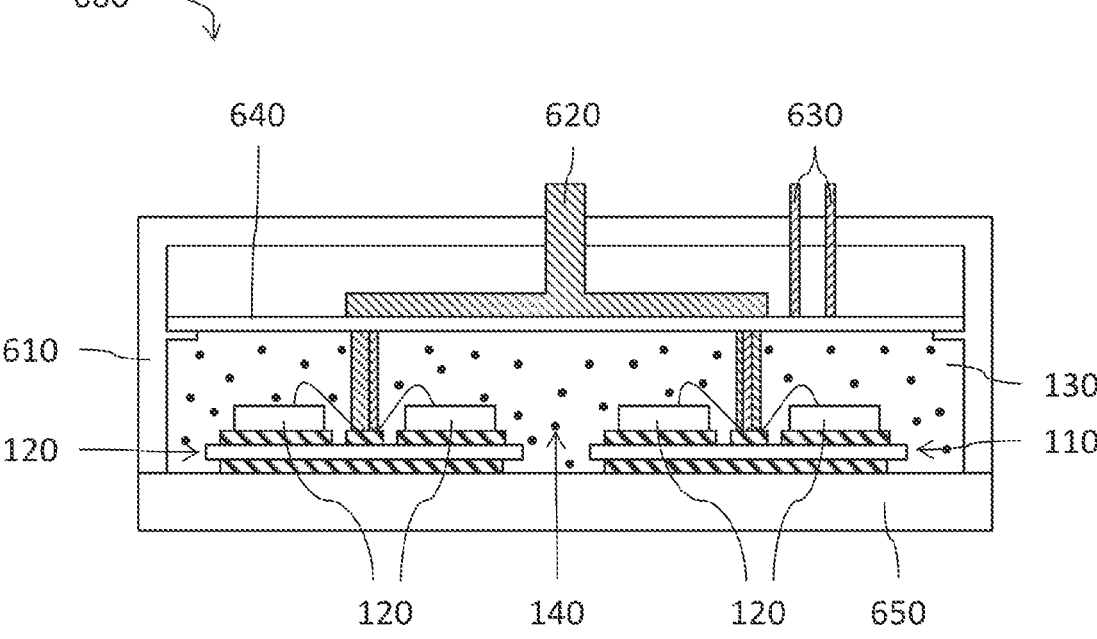
FIG. 6 shows a schematic sectional view of a further power semiconductor package comprising various electrically insulating components.

FIG. 6 shows a power semiconductor package 600 which may be similar or identical to the power semiconductor package 100, except for the differences described in the following.

The power semiconductor package 600 comprises a plurality of power semiconductor chips 120 arranged on substrates 110 and encapsulated by the encapsulant 130. The power semiconductor package 600 may further comprise a (hard) plastic frame 610 forming a cavity, wherein the encapsulant 130, the power semiconductor chips 120 and the substrates 110 are arranged in the cavity. The power semiconductor package 600 may comprise one or more power terminals 620 and/or one or more control terminals 630 which may be exposed at an upper main side of the power semiconductor package 600. The power terminals 620 may be coupled to the power semiconductor chips 120 and the control terminals 630 may be configured to transmit control signals to the power semiconductor chips 120.

According to an example, the power semiconductor package 600 may further comprise a control circuitry 640, e.g. arranged on a printed circuit board. The control circuitry 640 may e.g. be arranged in the cavity formed by the plastic frame 610. The control circuitry 640 may e.g. be configured to control the power semiconductor chips 120 and it may be coupled to the control terminals 630.

According to an example, the power semiconductor package 600 may further comprise a baseplate 650, wherein the substrates 110 are arranged on the baseplate 650. The baseplate 650 may e.g. be arranged at a lower main side of the power semiconductor package 600.

As described with reference to power semiconductor package 100, the encapsulant 130 of power semiconductor package 600 may comprise the voltage stabilizing additive 140. Additionally or alternatively, other components may comprise the voltage stabilizing additive 140 (wherein the voltage stabilizing additive 140 of different components of the power semiconductor package 600 may comprise the same substance or a different substance, e.g. benzophenone in one component and benzil in another component).

According to an example, the power semiconductor package 600 may comprise a silicone potting gel and/or a mold compound and/or a high hardness potting material and/or a passivating organic coating and/or a thermoplastic housing material and/or a frame glueing material, wherein one or more of these components may comprise the voltage stabilizing additive 140.

The mold compound may e.g. be based on epoxides, or acrylates, or silicones, or polyurethanes. The high hardness potting material may e.g. be based on epoxides, or acrylates, or silicones, or polyurethanes and it may comprise a filler material. The passivating organic coating may e.g. be arranged on chip edges and/or in substrate trenches and it may be based on a polyimide, or a polyamide-imide, or acrylates. The thermoplastic housing material may e.g. be based on PBT, or PPA, or PA, or PPS, or PPSO. The frame glueing material may e.g. be configured to glue the plastic frame 610 onto other components of the power semiconductor package 600 and it may e.g. be based on silicones, or epoxides, or acrylates, or methacrylates, or polyurethanes.

Figure 7:
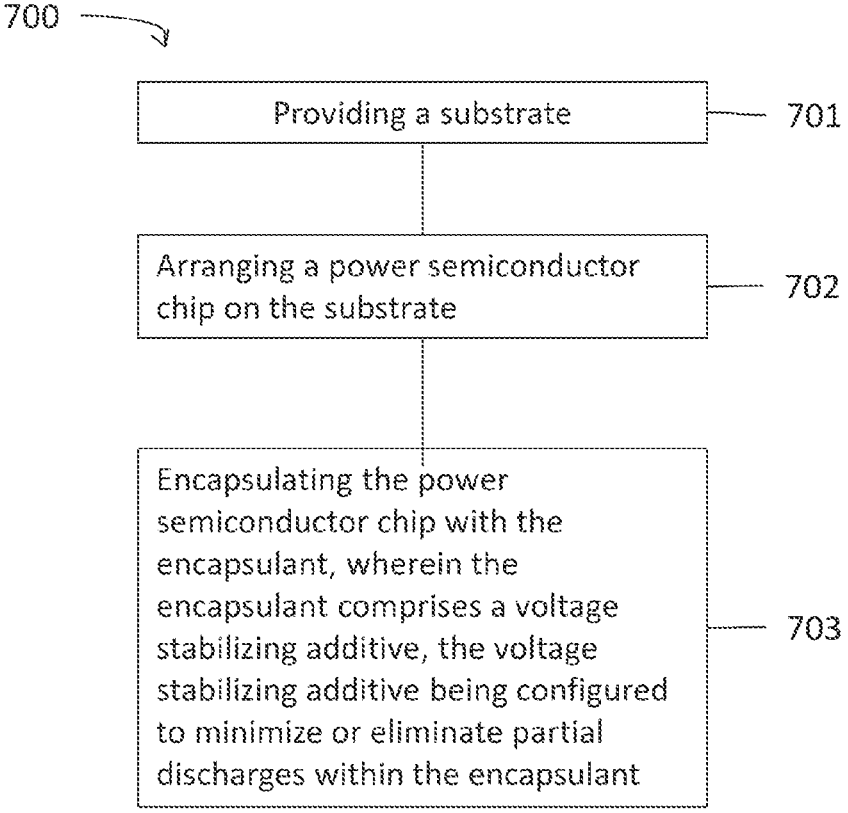
FIG. 7 shows a flow chart of a method for fabricating a power semiconductor package.

FIG. 7 shows a flow chart of a method 700 for fabricating a power semiconductor package. The method 700 may for example be used to fabricate the power semiconductor packages 100 and 600.

The method 700 comprises at 701 an act of providing a substrate, at 702 an act of arranging a power semiconductor chip on the substrate, and at 703 an act of encapsulating the power semiconductor chip with the encapsulant, wherein the encapsulant comprises a voltage stabilizing additive, the voltage stabilizing additive being configured to minimize or eliminate partial discharges within the encapsulant.

According to an example of method 700, the encapsulant comprises a polymer, wherein the voltage stabilizing additive is covalently bound into the polymer matrix of the polymer. According to another example of method 700, the voltage stabilizing additive is added to the encapsulant prior to encapsulating the power semiconductor chip with the encapsulant. Furthermore, the voltage stabilizing additive may be added to the encapsulant in the form of a powder or the voltage stabilizing additive may be added to the encapsulant dissolved in a solvent.

A further aspect of the disclosure concerns the use of a voltage stabilizing additive in a power semiconductor package, wherein the voltage stabilizing additive is configured to minimize or eliminate partial discharges within an encapsulant or any other suitable electrically insulating component of the power semiconductor package.

In the following, the power semiconductor package and the method for fabricating a power semiconductor package are further explained using specific examples.

Example 1 is a power semiconductor package, comprising: a substrate, a power semiconductor chip arranged on the substrate, and an encapsulant encapsulating the power semiconductor chip, wherein the encapsulant comprises a voltage stabilizing additive, the voltage stabilizing additive being configured to minimize or eliminate partial discharges within the encapsulant.

Example 2 is the power semiconductor package of example 1, wherein the encapsulant comprises a polymer.

Example 3 is the power semiconductor package of example 2, wherein the polymer is one or more of a silicone, a polyimide, an epoxy resin, an acrylate, and a polyurethane.

Example 4 is the power semiconductor package of one of the preceding examples, wherein the voltage stabilizing additive comprises one or more of a thioxanthone, a benzil, a benzophenone, an acetophenone, a nitrated aromatic structure, a halogenated aromatic, a fullerene, a $SiO_2$-particle, a polycyclic aromatic, a phenylenediamine, a methylated phenothiazine, and a malononitrile.

Example 5 is the power semiconductor package of one of examples 2 to 4, wherein the voltage stabilizing additive is covalently bound into the polymer matrix of the polymer.

Example 6 is the power semiconductor package of one of the preceding examples, further comprising: a plastic frame forming a cavity, wherein the encapsulant is arranged in the cavity, and wherein the plastic frame comprises the voltage stabilizing additive, the voltage stabilizing additive being configured to minimize or eliminate partial discharges within the plastic frame.

Example 7 is the power semiconductor package of example 6, wherein the plastic frame comprises a different voltage stabilizing additive than the encapsulant.

Example 8 is the power semiconductor package of one of the preceding examples, wherein the content of the voltage stabilizing additive in the encapsulant is in the range of 0.1 wt % to 10 wt %.

Example 9 is the power semiconductor package of one of the preceding examples, wherein the encapsulation comprises a passivating organic coating, the passivating organic coating being arranged at edges of the power semiconductor chip and/or at edges and/or at trenches of the substrate, wherein the passivating organic coating comprises the voltage stabilizing additive.

Example 10 is the power semiconductor package of example 9, wherein the passivating organic coating has a different material composition than the rest of the encapsulation.

Example 11 is a method for fabricating a power semiconductor package, the method comprising: providing a substrate, arranging a power semiconductor chip on the substrate, and encapsulating the power semiconductor chip with the encapsulant, wherein the encapsulant comprises a voltage stabilizing additive, the voltage stabilizing additive being configured to minimize or eliminate partial discharges within the encapsulant.

Example 12 is the method of example 11, wherein the encapsulant comprises a polymer and wherein the voltage stabilizing additive is covalently bound into the polymer matrix of the polymer.

Example 13 is the method of example 11 or example 12, wherein the voltage stabilizing additive comprises one or more of a thioxanthone, a benzil, a benzophenone, an acetophenone, a nitrated aromatic structure, a halogenated aromatic, a fullerene, a $SiO_2$-particle, a polycyclic aromatic, a phenylenediamine, a methylated phenothiazine, and a malononitrile.

Example 14 is the method of one of examples 11 to 13, further comprising: adding the voltage stabilizing additive to the encapsulant prior to encapsulating the power semiconductor chip, wherein the voltage stabilizing additive is added to the encapsulant in the form of a powder or wherein the voltage stabilizing additive is added to the encapsulant dissolved in a solvent.

Example 15 is a use of a voltage stabilizing additive in a power semiconductor package, the voltage stabilizing additive being configured to minimize or eliminate partial discharges within an encapsulant of the power semiconductor package.

Example 16 is an apparatus comprising means for performing the method according to one of the examples 11 to 14.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power semiconductor package, comprising:

a substrate;

a power semiconductor chip arranged on the substrate; and an encapsulant encapsulating the power semiconductor chip, wherein the encapsulant comprises a voltage stabilizing additive, wherein the voltage stabilizing additive comprises one or more of a thioxanthone, a benzil, an acetophenone, a nitrated aromatic structure, a halogenated aromatic, a fullerene, a polycyclic aromatic, a phenylenediamine, a methylated phenothiazine, and a malononitrile, wherein on impact of a free electron with a molecule of the voltage stabilizing additive, the free electron ionizes the molecule such that a stable radical cation is created and two electrons having a comparatively lower energy than the encapsulant are released, wherein the encapsulant comprises a polymer, and wherein the voltage stabilizing additive is covalently bound into a polymer matrix of the polymer.

\* \* \* \* \*